(12) United States Patent
Lan et al.

(10) Patent No.: US 11,697,876 B2
(45) Date of Patent: Jul. 11, 2023

(54) MECHANISM FOR CREATING VACUUM IN PROCESSING APPARATUS

(71) Applicant: Taiwan Semiconductor Manufacturing Company, Ltd., Hsinchu (TW)

(72) Inventors: Yung-Syuan Lan, Taipei (TW); Chia-Wei Chen, Chiayi (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 204 days.

(21) Appl. No.: 17/117,685

(22) Filed: Dec. 10, 2020

(65) Prior Publication Data

US 2021/0095376 A1 Apr. 1, 2021

Related U.S. Application Data

(63) Continuation of application No. 15/939,383, filed on Mar. 29, 2018, now Pat. No. 10,865,479.

(60) Provisional application No. 62/586,988, filed on Nov. 16, 2017.

(51) Int. Cl.
  *C23C 16/455* (2006.01)
  *C23C 16/44* (2006.01)
  *H01J 37/32* (2006.01)

(52) U.S. Cl.
  CPC .... *C23C 16/45565* (2013.01); *C23C 16/4405* (2013.01); *C23C 16/4412* (2013.01); *C23C 16/45574* (2013.01); *H01J 37/3244* (2013.01); *H01J 37/32357* (2013.01); *H01J 37/32862* (2013.01)

(58) Field of Classification Search
  CPC .......... H01J 37/32862; C23C 16/4412; C23C 16/4405
  See application file for complete search history.

(56) References Cited

U.S. PATENT DOCUMENTS

| | | | | |
|---|---|---|---|---|
| 3,955,669 A | * | 5/1976 | Homilius | B65G 27/00 198/755 |
| 5,123,502 A | * | 6/1992 | Flugger | F01N 3/00 181/269 |
| 5,655,361 A | | 8/1997 | Kishi | |
| 2004/0161372 A1 | * | 8/2004 | Carlsen | B01D 53/46 422/171 |

(Continued)

*Primary Examiner* — Joseph A Miller, Jr.
(74) *Attorney, Agent, or Firm* — McClure, Qualey & Rodack, LLP

(57) ABSTRACT

A processing apparatus is provided. The processing apparatus includes a processing chamber, a pump, and an intersecting module. The process chamber has a gas outlet. The pump communicates with the gas outlet. The pump is configured to exhaust gas from the processing chamber via the gas outlet. The intersecting module is positioned between the pump and the gas outlet. The intersecting module includes a plurality of support members and a plurality of internal ventilating plates. The support members are arranged along a longitudinal direction. Each of the internal ventilating plates has a plurality of orifices. At least one of the internal ventilating plates is positioned between two of the support members positioned adjacent to each other in the longitudinal direction. Each of the internal ventilating plates is inclined relative to a transversal direction that is perpendicular to the longitudinal direction.

20 Claims, 6 Drawing Sheets

(56) References Cited

U.S. PATENT DOCUMENTS

2006/0037702 A1 2/2006 Hayashi et al.
2006/0121211 A1 6/2006 Choi
2010/0307864 A1* 12/2010 Bohata .................... F01N 1/083
   181/254

* cited by examiner

MECHANISM FOR CREATING VACUUM IN PROCESSING APPARATUS

PRIORITY CLAIM AND CROSS-REFERENCE

This application is a Continuation Application of the U.S. patent application Ser. No. 15/939,383, filed on Mar. 29, 2018, now U.S. Pat. No. 10,865,479, which claims the benefit of U.S. Provisional Application No. 62/586,988, filed on Nov. 16, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

ICs are typically fabricated by processing one or more wafers as a "lot" with a series of wafer fabrication tools (i.e., "processing apparatus"). Each processing apparatus typically performs a single wafer fabrication task on the wafers in a given lot. For example, a particular processing apparatus may perform layering, patterning and doping operations or thermal treatment. A layering operation typically adds a layer of a desired material to an exposed wafer surface. A patterning operation typically removes selected portions of one or more layers formed by layering. A doping operation typically incorporates dopants directly into the silicon through the wafer surface, to produce p-n junctions. A thermal treatment typically heats a wafer to achieve specific results (e.g., dopant drive-in or annealing).

Although existing processing apparatus have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
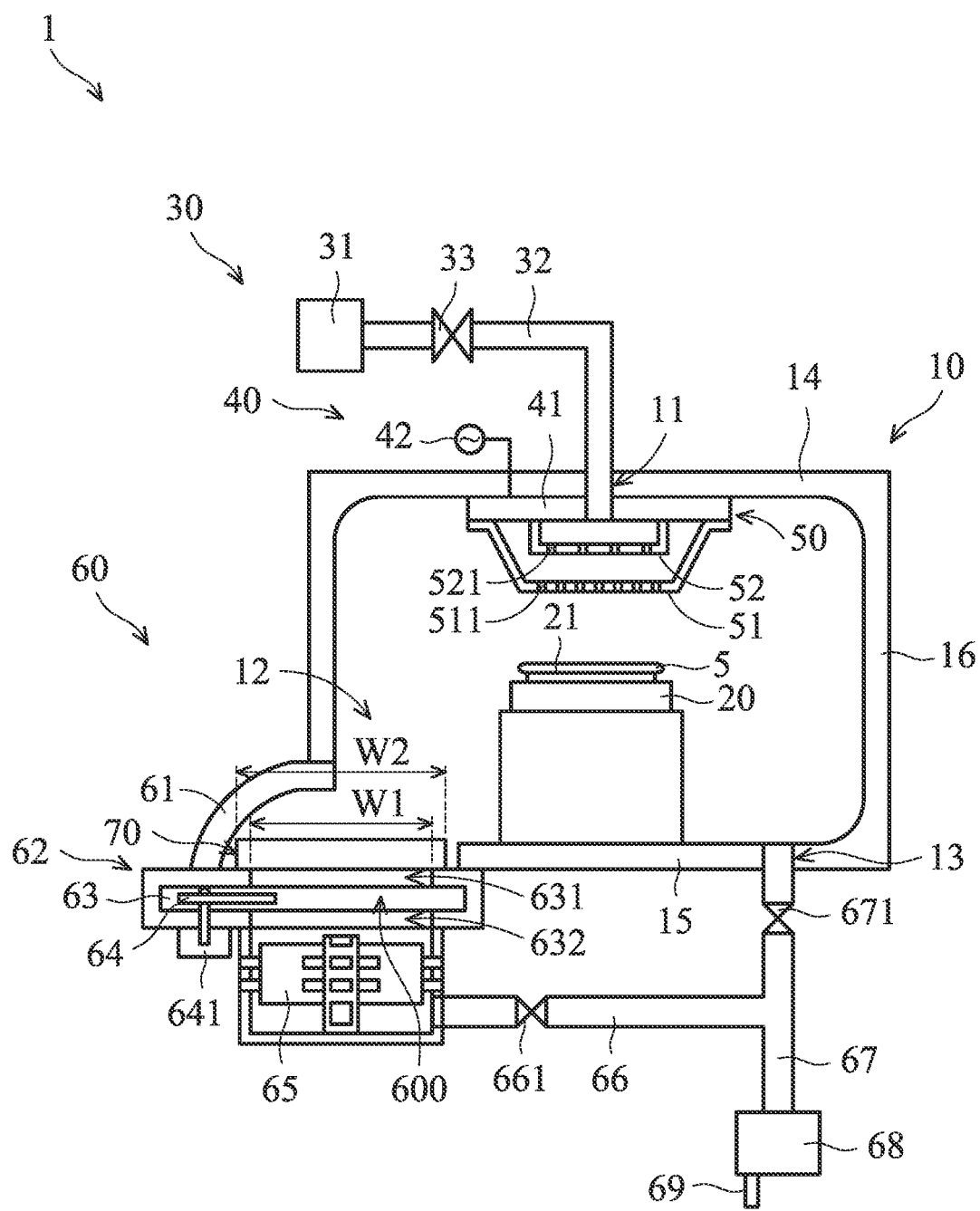
FIG. 1 shows a schematic diagram of a processing apparatus in semiconductor fabrication, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is a schematic view of a processing apparatus 1 in accordance with some embodiments of the disclosure. The processing apparatus 1 is configured to perform a semiconductor manufacturing process on a semiconductor wafer 5.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The semiconductor manufacturing process conducted by the processing apparatus 1 may be any process performed under a vacuum surrounding. For example, the semiconductor manufacturing process is, but not limited to, a chemical vapor deposition (CVD) process, a physical vapor deposition (PVD) process, an etching process, a sputtering deposition process, or an annealing process.

In some embodiments, the processing apparatus 1 is a CVD plasma processing apparatus and is configured to perform a CVD process on the semiconductor wafer 5. The processing apparatus 1 includes a processing chamber 10, a wafer chuck 20, a reaction-gas-supply device 30, a radio frequency device 40, a gas distribution device 50, and a pump assembly 60.

The wafer chuck 20 is disposed in the processing chamber 10. The wafer chuck 20 is configured to support the semiconductor wafer 5. In some embodiments, the wafer chuck 20 is an electrostatic chuck (E-chuck). The wafer chuck 20 has a supporting surface 21 parallel to with the horizontal plane, and faces the gas distribution device 50. The semiconductor wafer 5 supported by the wafer chuck 20 is in contact with the supporting surface 21.

The reaction-gas-supply device 30 is configured to supply reaction gases into the processing chamber 10. In some embodiments, the reaction gases include tetra-ethoxy-silane (TEOS) and oxygen. TEOS and oxygen are used to form an oxide layer on the semiconductor wafer 5.

The reaction-gas-supply device 30 includes a reaction-gas container 31, a gas-supply tube 32, and a reaction-gas-supply element 33. The reaction-gas container 31 is configured to store the reaction gases. The gas-supply tube 32 communicates with the reaction-gas container 31 and the processing chamber 10. In some embodiments, one end of the gas-supply tube 32 is connected to the reaction-gas container 31. The other end of the gas-supply tube 32 is connected to an inlet 11 of the processing chamber 10. In some embodiments, the inlet 11 is located at a top wall of the processing chamber 10. The inlet 11 faces the wafer chuck 20, and is located above the center of the supporting surface 21.

The reaction-gas-supply element 33 is installed on the gas-supply tube 32. The reaction-gas-supply element 33 is configured to control the flow rate of the reaction gas in the gas-supply tube 32. In some embodiments, the reaction-gas-supply element 33 is a valve or a pump.

The radio frequency device 40 is configured to generate an electric field in the processing chamber 10 to excite the reaction gas into plasma. The radio frequency device 40 is located at the top of the processing chamber 10, and located over the wafer chuck 20. The radio frequency device 40 includes an electrode 41 and a radio frequency power 42. The electrode 41 is located over the gas distribution device 50. In some embodiments, the electrode 41 is a plate structure parallel with the supporting surface 21. The area of the main surface of the electrode 41 corresponds to the area of the supporting surface 21 of the wafer chuck 20.

The radio frequency power 42 is electrically connected to the electrode 41. The radio frequency power 42 element provides radio frequency energy to the electrode 41. In some embodiments, the wafer chuck 20 is as another electrode 41 of the radio frequency device 40. The radio frequency power 42 is electrically connected to the wafer chuck 20, and the radio frequency power 42 provides radio frequency energy to the wafer chuck 20. In some embodiments, the wafer chuck 20 is grounded.

In some embodiments, the reaction gas (plasma source gas) may be remotely excited outside the processing chamber 10 in a waveguide portion prior to entering into the processing chamber 10 in a downstream plasma process, for example the reaction gases excited by a microwave source e.g., 2.45 GHz in a waveguide portion upstream from the processing chamber 10.

The gas distribution device 50 is disposed in the processing chamber 10, and configured to distribute the reaction gas in the processing chamber 10. In some embodiments, the gas distribution device 50 is located at the top of the processing chamber 10. The gas distribution device 50 is located between the electrode 41 and the wafer chuck 20.

The gas distribution device 50 includes a first shower plate 51 located over the wafer chuck 20. As shown in FIG. 1, the first shower plate 51 is located between the wafer chuck 20 and the electrode 41. The first shower plate 51 is parallel with the supporting surface 21. In some embodiments, the area of the main surface of the first shower plate 51 corresponds to the area of the supporting surface 21 of the wafer chuck 20. The first shower plate 51 includes first dispensing holes 511 for the reaction gas to pass through. In some embodiments, the first dispensing holes 511 are arranged in an array. By the first dispensing holes 511, the reaction gas uniformly flows toward the semiconductor wafer 5 or wafer chuck 20.

In some embodiments, the gas distribution device 50 further includes a second shower plate 52 located over the first shower plate 51. As shown in FIG. 1, the second shower plate 52 is located between the first shower plate 51 and the electrode 41. The second shower plate 52 is parallel with the supporting surface 21, and separated from the first shower plate 51. The second shower plate 52 includes second dispensing holes 521 for the reaction gas to pass through. In some embodiments, the second dispensing holes 521 are arranged in an array.

The reaction gas flows uniformly through the second dispensing holes 521 toward the first dispensing holes 511. Therefore, the uniformity of the reaction gas flowing toward the semiconductor wafer 5 or wafer chuck 20 is improved by the second shower plate 52. In some embodiments, there are more first dispensing holes 511 than second dispensing holes 521. The diameter of the first dispensing holes 511 is greater than the diameter of the second dispensing holes 521.

The pump assembly 60 is configured to remove the gas or plasma in the processing chamber 10. In accordance with some embodiments, the pump assembly 60 includes a number of pumps, such as pump 65 and pump 68.

The pump 65 is configured to create a high vacuum in the processing chamber 10. In some embodiments, as shown in FIG. 1, the pump 65 is placed in communication with a gas outlet 12 of the processing chamber 10 via an exhaust conduit 61. The gas outlet 12 that communicates with the pump 65 may be formed at an intersection of a side wall 16 and a bottom wall 15 of the processing chamber 10. However, it should be appreciated that many variations and modifications can be made to embodiments of the disclosure. The gas outlet 12 may be formed at any portion of the processing chamber 10. The exhaust conduit 61 may include a curved side wall with a decreasing height in a direction away from the gas outlet 12 of the processing chamber 10, as shown in FIG. 1. The pump 65 may include, but is not limited to, a turbo-molecular pump.

The pump 68 is configured to create a rough vacuum in the processing chamber 10. In some embodiments, as shown in FIG. 1, the pump 68 is placed in communication with a gas outlet 13 of the processing chamber 10 via a pump-out line 67. The gas outlet 13 that communicates with the pump 68 may be formed at the bottom wall 15 of the processing chamber 10. However, it should be appreciated that many variations and modifications can be made to embodiments of the disclosure. The gas outlet 13 may be formed at any portion of the processing chamber 10. The pump 68 may include, but is not limited to, a roughing pump.

The pump 65 is communicated with the pump-out line 67 via an exhaust line 66. A valve 661 and a valve 671 are respectively connected to the exhaust line 66 and the pump-out line 67. The valve 661 is configured to isolate the pump 65 from the pump 68, and the valve 671 is configured to isolate the processing chamber 10 from the roughing pump 68.

In some embodiments, the pump assembly 60 further includes a gate valve 62 positioned closer to the gas outlet 12 than the pump 65. The gate valve 62 includes a valve housing 63 and a valve member 64. The valve housing 63 is a hollow structure with a front opening 631 and a rear opening 632 formed at two opposite sides of the valve housing 63. The front opening 631 is connected to one end of the exhaust conduit 61, and the rear opening 632 is connected to the pump 65.

The valve member 64 is positioned in the valve housing 63. The valve member 64 varies the area of a flow path 600 from the processing chamber 10 to the pump 65. In this manner, the valve member 64 is able to regulate pressure in the processing chamber 10 in cooperation with the pump 65. In some embodiments, in operation, the pump 65 maintains a constant output, and the position of the valve member 64 in the valve housing 63 is adjusted by a valve controller 641. As a result, a cross-sectional area of the flow path 600 from the processing chamber 10 to the pump 65 is adjusted, and the pressure in the processing chamber 10 can be precisely controlled.

In cases where the gate valve 62 is positioned between the gas outlet 12 and the pump 65, gas from the processing chamber 10 is pumped out via the exhaust conduit 61 and the interior of the valve housing 63. Therefore, the exhaust conduit 61 and the interior of the valve housing 63 (including the front opening 631 and the rear opening 632) are cooperatively referred to as a "flow path" that allows the processing chamber 10 to communicate with the pump 65. In some embodiments, the gate valve 62 is omitted. The pressure in the processing chamber 10 at high vacuum is controlled by the pump 65. Therefore, the exhaust conduit 61 is referred to as a "flow path" that allows the processing chamber 10 to communicate with the pump 65.

The intersecting module 70 is configured to remove particles in the flow path 600 connecting the processing chamber 10 and the pump 65 so as to mitigate or avoid contamination of the pump 65 and of the semiconductor wafer 5 being processed by the processing chamber 10. In cases where the gate valve 62 is positioned between the gas outlet 12 and the pump 65, the intersecting module 70 is connected to the front opening 631 of the valve housing 63, as shown in FIG. 1. However, it should be appreciated that many variations and modifications can be made to embodiments of the disclosure. The intersecting module 70 may be located at any suitable location in the flow path 600 that allows the processing chamber 10 to communicate with the pump 65. For example, the intersecting module 70 is connected to an inlet of the pump 65.

Figure 2:
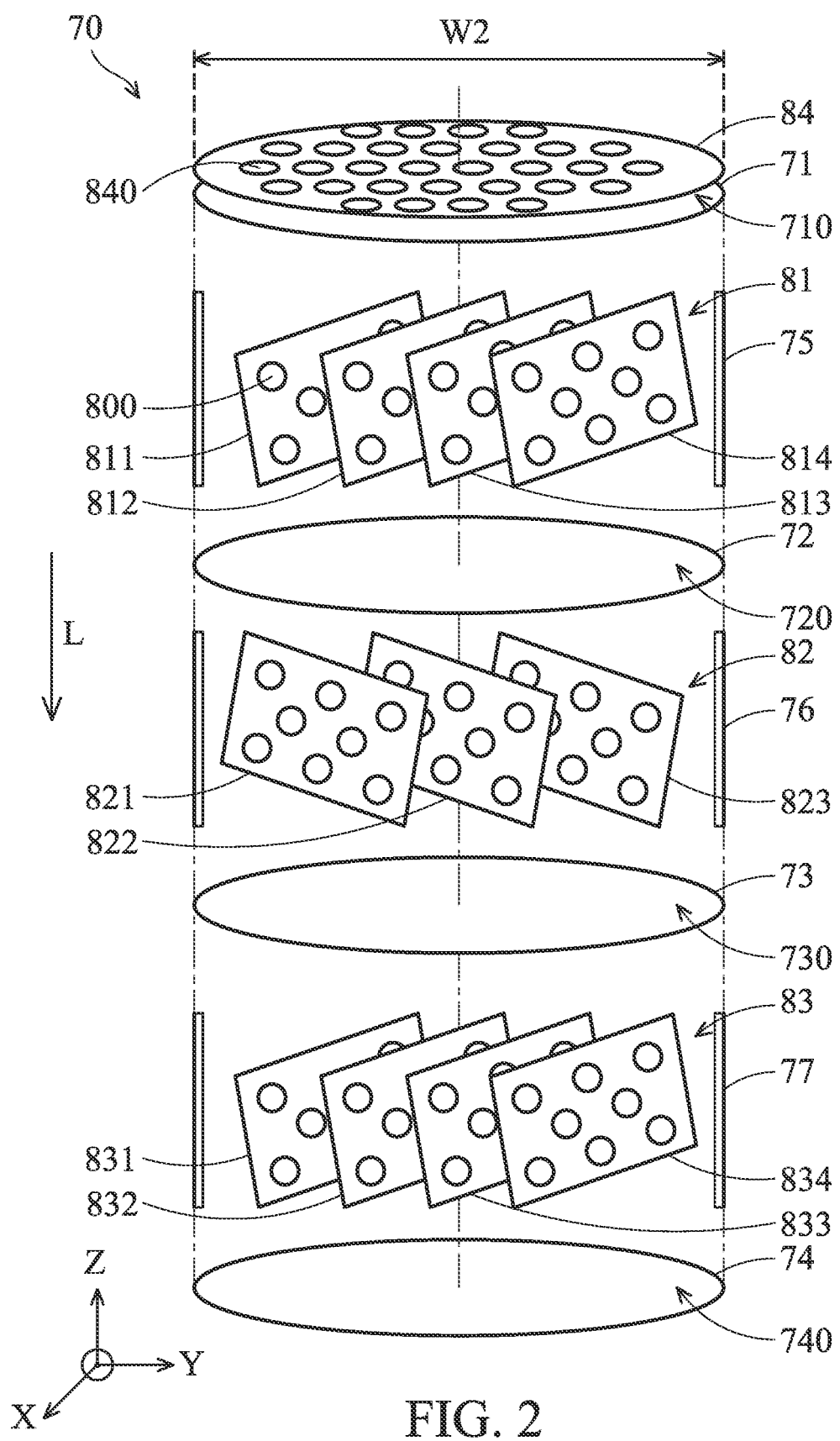
FIG. 2 shows an exploded view of an intersecting module, in accordance with some embodiments.

FIG. 2 shows an exploded view of the intersecting module 70, in accordance with some embodiments. In some embodiments, the intersecting module 70 includes a number of support members, such as support members 71, 72, 73 and 74. The support members 71, 72, 73 and 74 are arranged along the longitudinal direction L and parallel with one another. The support members 71, 72, 73 and 74 are arranged in order, and the support member 71 is closer to the gas outlet 12 (FIG. 1) of the processing chamber 10 than the support members 72, 73 and 74.

The support member 74 which is located farthest from the support member 71 is fixed on the gate valve 62 of the pump 65 (FIG. 1) by any suitable means, such as screwing. The support members 71, 72, 73 and 74 may have a consistent width W2. The width W2 may be greater or equal to a width W1 of the front opening 631, as shown in FIG. 1. As a result, the front opening 631 is entirely covered by the intersecting module 70, when the intersecting module 70 is centered relative to the front opening 631.

Back to FIG. 2, the support members 71, 72, 73 and 74 may be spaced from one another by a consistent distance. Alternatively, the distance between the neighboring support members 71, 72, 73 and 74 may be varied according to demand. In some embodiments, the sum of the spacing distance between the neighboring support members 71, 72, 73 and 74 is smaller than a predetermined limit. For example, the sum of the spacing distance between the neighboring support members 71, 72, 73 and 74 is smaller than a distance between the front opening 631 and the side wall of the exhaust conduit 61, so as to prevent interference between the intersecting module 70 and the exhaust conduit 61.

In some embodiments, each of the support members 71, 72, 73 and 74 includes a ring structure with an opening, such as openings 710, 720, 730 and 740 formed therein. The openings 710, 720, 730 and 740 of the support members 71, 72, 73 and 74 may be circular, oval, rectangular, or another shape. In some embodiments, the openings 710, 720, 730 and 740 of the support members 71, 72, 73 and 74 have a width that is slightly less than the width W1 of the front opening 631. In some embodiments, the openings 710, 720, 730 and 740 of the support members 71, 72, 73 and 74 have a width that is substantially equal to the width W1 of the front opening 631.

The intersecting module 70 further includes a number of connecting rods, such as connecting rods 75, 76 and 77. The connecting rods 75 connect the support member 71 with the support member 72. The connecting rods 76 connect the support member 72 with the support member 73. The connecting rods 77 connect the support member 73 with the support member 74. Therefore, there are multiple channels formed among the connecting rods and the support members for gas passing through. In some embodiments, there are three connecting rods between the neighboring support members 71, 72, 73 and 74.

The intersecting module 70 further includes a number of internal ventilating plates having a number of orifices 800. The internal ventilating plates are positioned between two neighboring support members 71, 72, 73 and 74. For example, the intersecting module 70 includes a first group of internal ventilating plates 81, a second group of internal ventilating plates 82 and a third group of internal ventilating plates 83. The first group of internal ventilating plates 81 is positioned between the support member 71 and the support member 72. The second group of internal ventilating plates 82 is positioned between the support member 72 and the support member 73. The third group of internal ventilating plates 83 is positioned between the support member 73 and the support member 74.

In some embodiments, the first group of internal ventilating plates 81 includes four internal ventilating plates 811, 812, 813 and 814, the second group of internal ventilating plates 82 includes three internal ventilating plates 821, 822 and 823, and the third group of internal ventilating plates 83 includes four internal ventilating plates 831, 832, 833 and 834. The internal ventilating plates in each of the group 81, 82 and 83 are arranged in parallel with one another and distant from one another by a predetermined distance.

Figure 3:
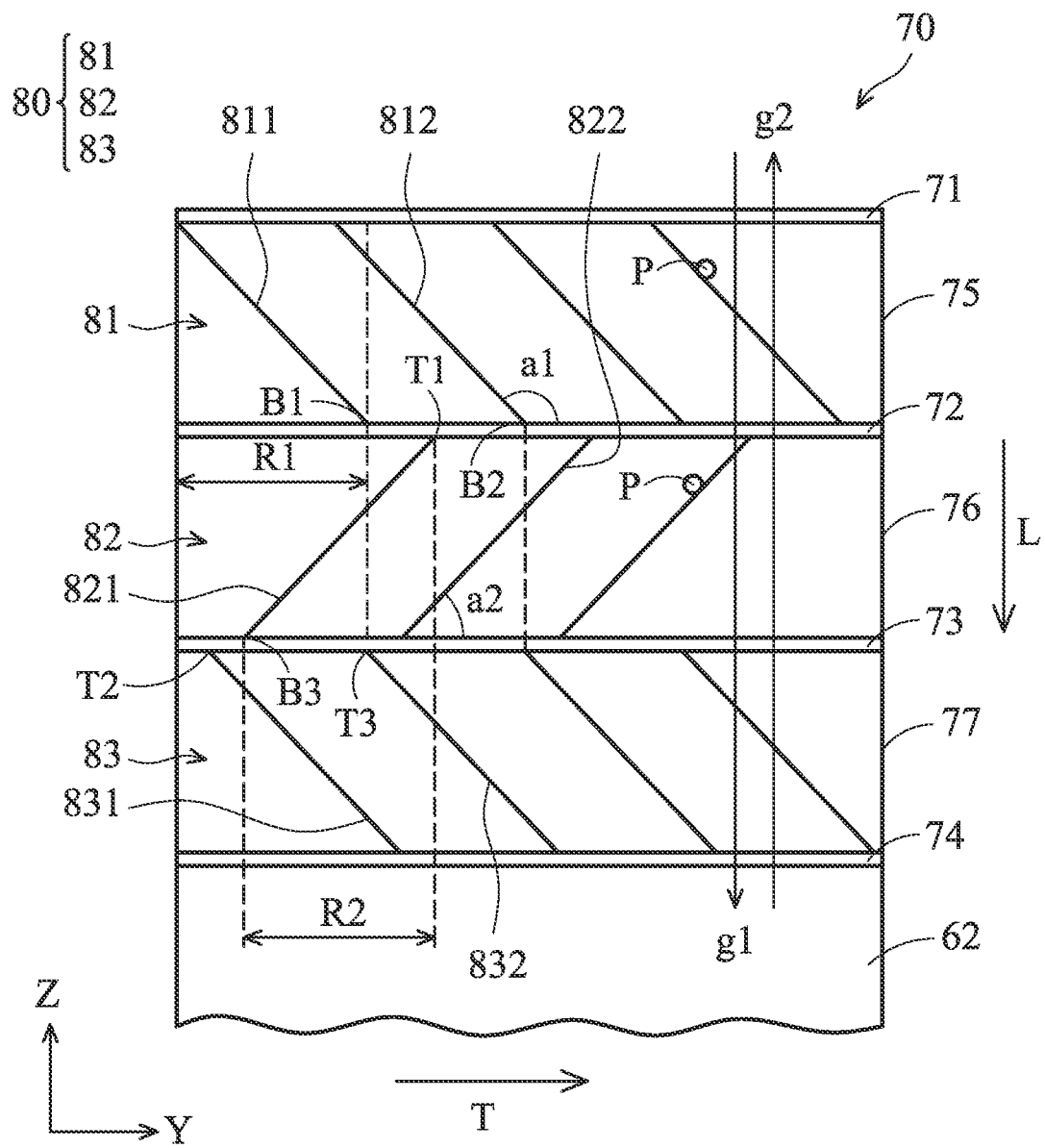
FIG. 3 shows a cross-sectional view of an intersecting module, in accordance with some embodiments.

In some embodiments, the internal ventilating plates positioned on the neighboring support members are arranged in a staggered manner. For example, as shown in FIG. 3, a top edge T1 of the internal ventilating plate 821 is located between bottom edges B1 and B2 of the internal ventilating plates 811 and 812. In addition, a bottom edge B3 of the internal ventilating plate 821 is located between top edges T2 and T3 of the internal ventilating plates 831 and 832.

In addition, the internal ventilating plates are inclined relative to a transversal direction T that is perpendicular to the longitudinal direction L. The included angles between the internal ventilating plates positioned on two neighboring support members and the transversal direction T may be the same or different. For example, the internal ventilating plate 812 positioned on the support member 72 is inclined relative to the transversal direction T by an angle a1. On the contrary, the internal ventilating plate 822 positioned on the support member 73 is inclined relative to the transversal direction T by an angle a2. The angle a1 is different from the angle a2. In some embodiments, angle a1 is an obtuse angle, and angle a2 is an acute angle.

As a result, projections of the two internal ventilating plates that are positioned on the neighboring support members overlap. For example, the projection R1 of the internal ventilating plate 811 in the longitudinal direction overlaps the projection R2 of the internal ventilating plate 821 in the longitudinal direction. Therefore, in some embodiments, a three-dimensional gas filter 80 is constituted by the internal ventilating plates and positioned in a space defined by the support members 71, 72, 73 and 74. When observed from the longitudinal direction L, a partial area or the entire area of the opening 710 of the support member 71 is covered by the three-dimensional gas filter 80.

Referring again to FIG. 2, in some embodiments, the intersecting module 70 further includes a boundary ventilating plate 84. The boundary ventilating plate 84 has a number of orifices 840 and is positioned on the support member 71 which is closest to the gas outlet 12 (FIG. 1). The boundary ventilating plate 84 is arranged perpendicular to the longitudinal direction L and covers the entire area of the opening 710 of the support member 71. In some other embodiments, the boundary ventilating plate 84 is omitted. In some other embodiments, each of the support members 71, 72, 73 and 74 is covered by one boundary ventilating plate 84.

Figure 4:
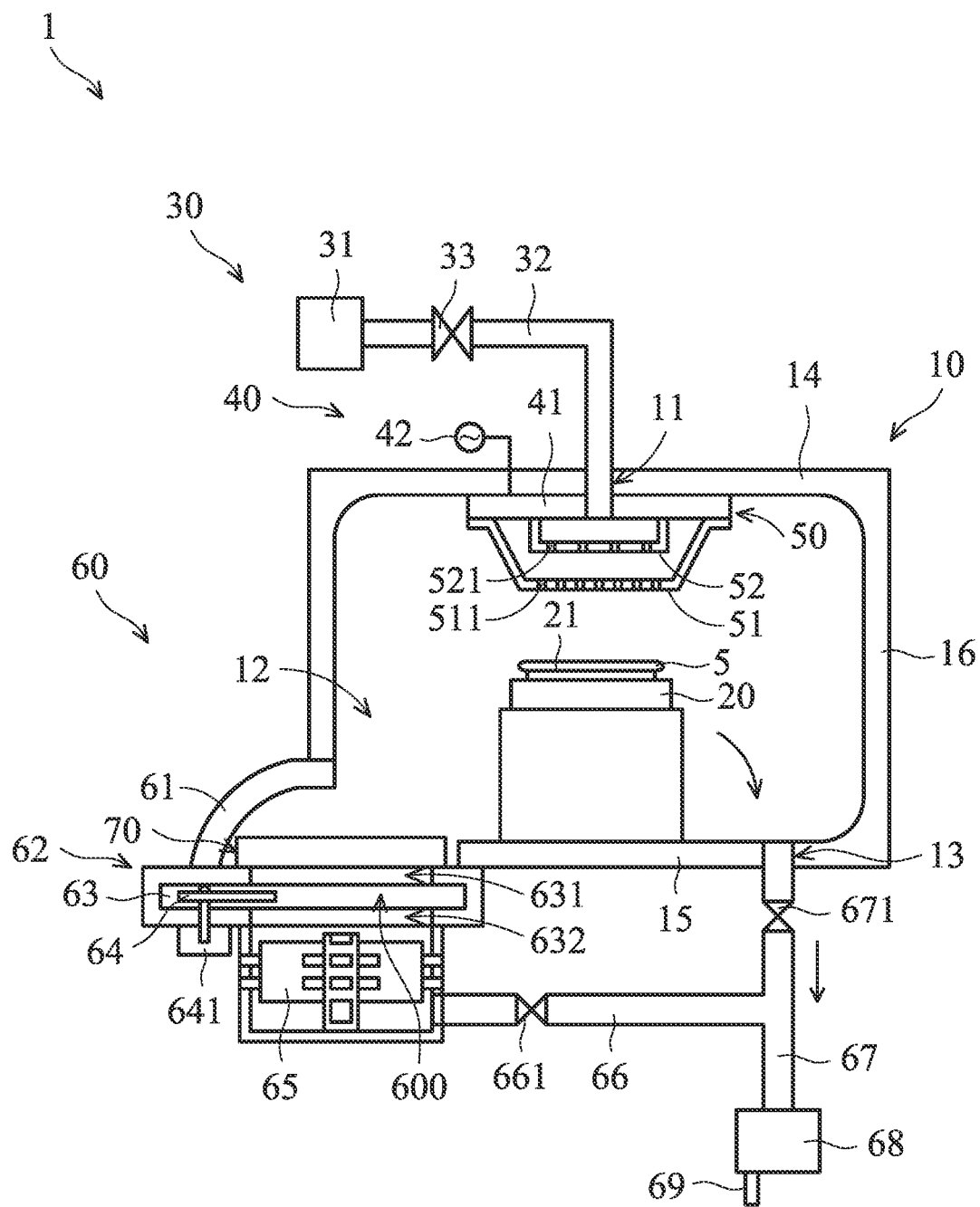
FIG. 4 shows one stage of a method for creating a vacuum in a processing chamber, in accordance with some embodiments.
Figure 5:
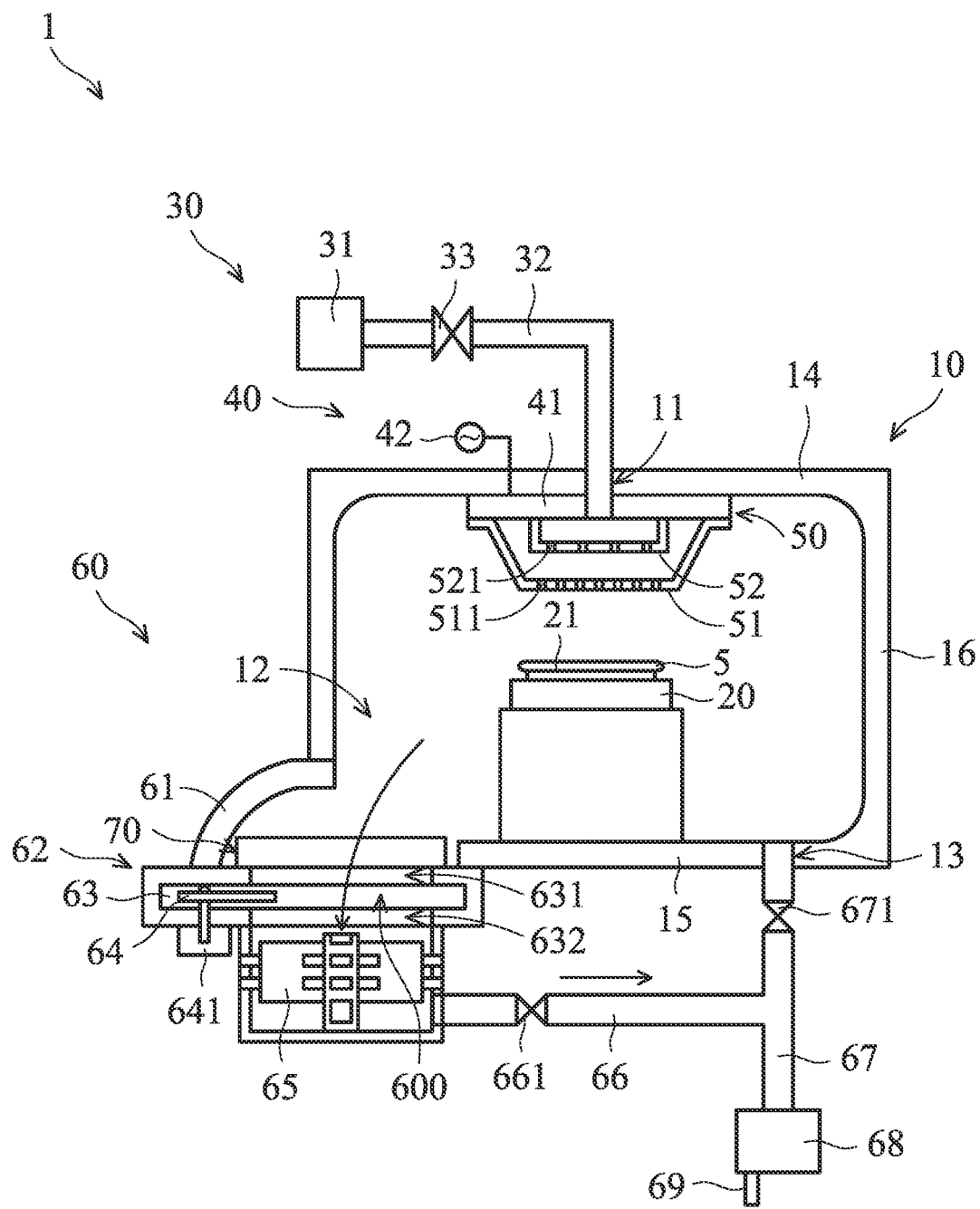
FIG. 5 shows one stage of a method for creating a vacuum in a processing chamber, in accordance with some embodiments.

In some embodiments, a high vacuum in the processing chamber 10 is created by the following two stages. In a first stage, as shown in FIG. 4, the valve 661 is closed and the valve 671 is open, and gas in the processing chamber 10 is pumped out by the pump 68 via the pump-out line 67 and exhausted from the pump 68 via a pump outlet 69. After a rough vacuum is created in the processing chamber 10, the first stage is completed, and a second stage is initiated. In the second stage, as shown in FIG. 5, valve 661 is open and valve 671 is closed, and gas in the processing chamber 10 is pumped out by the pump 65 via the exhaust conduit 61 and the exhaust line 66 and exhausted from the pump 68 via the pump outlet 69.

Referring to FIG. 3 with reference to FIG. 1, when gas flow g1 from the processing chamber 10 flows through the intersecting module 70 during the second stage, particles P are dislodged from the gas flow g1 by the internal ventilating plates of the three-dimensional gas filter 80. Therefore, contamination of the gate valve 62 and the pump 65 can be mitigated or prevented. In addition, the intersecting module 70 is also capable of removing particles P from a back-stream gas flow g2 from the pump 65. The flowing of the back-stream gas flow g2 may occur when the pressure in the pump 65 is higher than the pressure in the processing chamber 10. Therefore, the particles that have accumulated in the pump 65 or the gate valve 62 will not easily enter the processing chamber 10, and contamination of the processing chamber 10 and the semiconductor wafer 5 can be mitigated or prevented.

It should be noted that, due to the inclined and staggered arrangement of the internal ventilating plates, most of the contamination particles P are dislodged from the gas flow even when an elastic collision of the contamination particles P occurs while passing through the internal ventilating plates. In addition, with the orifices formed on the internal ventilating plates, the gas flow is allowed to pass through the intersecting module unhindered. Therefore, there will be no decline in the efficiency of creating a vacuum in the processing chamber.

Figure 6:
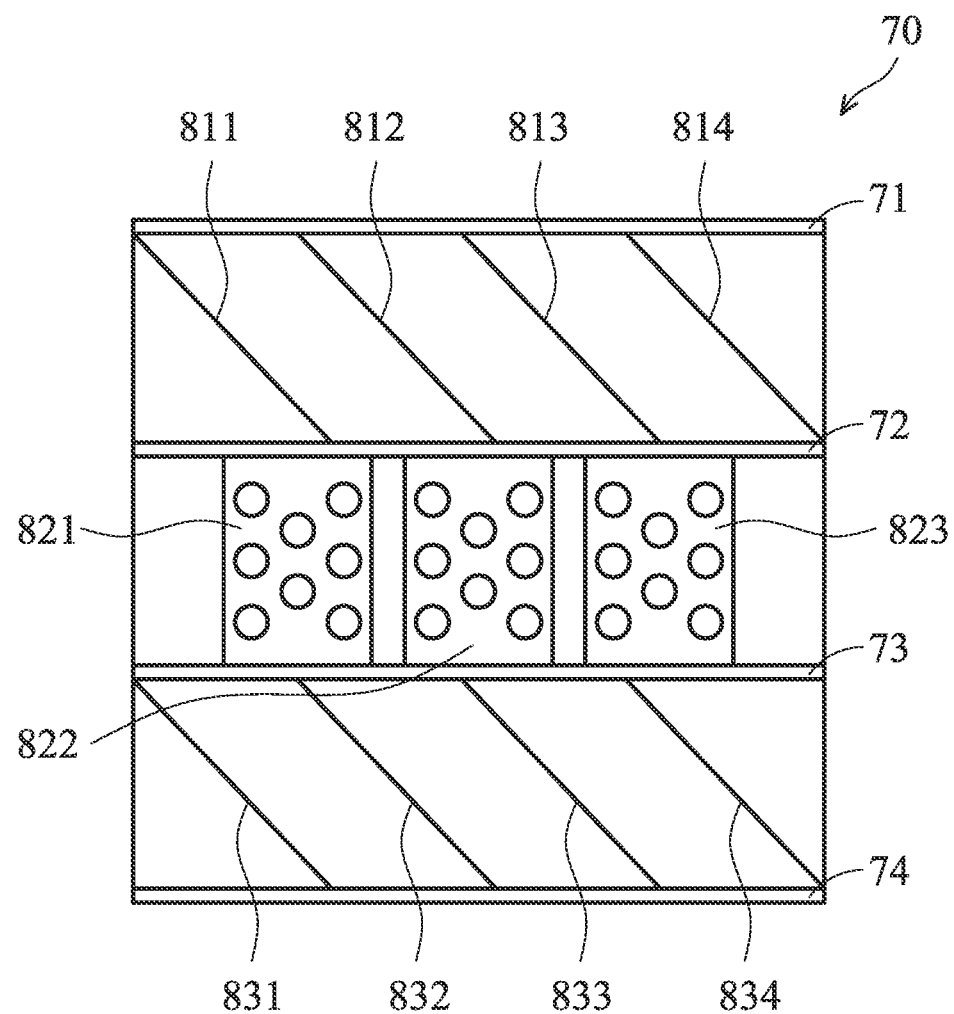
FIG. 6 shows a cross-sectional view of an intersecting module, in accordance with some embodiments.

In some embodiments, the internal ventilating plates positioned on neighboring support members face different directions. For example, as shown in FIG. 6, the internal ventilating plates 811, 812, 813 and 814 face a first direction that is parallel with the Y-axis, and the internal ventilating plates 831, 832, 833 and 834 face the first direction that is parallel with the Y-axis, as well. The internal ventilating plates 821, 822 and 823 face a second direction that is parallel with the X-axis and perpendicular to the Y-axis. Therefore, the internal ventilating plates positioned on neighboring support members 72 and 73 face two directions that are perpendicular to each other. However, it should be appreciated that many variations and modifications can be made to embodiments of the disclosure. The internal ventilating plates positioned on neighboring support members may face different directions that included an acute angle or an obtuse angle.

Embodiments of creating a vacuum in a processing apparatus in a semiconductor fabrication described above use multiple ventilating plates for handling the gas flow. The ventilating plates allow the gas flow to pass through but efficiently dislodge contaminant particles which may lead to a reduction of semiconductor wafer yield. Therefore, wafer scrap can be prevented. In addition, since most particles are filtered by the ventilating plates, the time period for shutting off the processing apparatus for a cleaning processing can be prolonged, and fabrication cost and time are reduced.

In accordance with some embodiments, a processing apparatus is provided. The processing apparatus includes a processing chamber, a pump, and an intersecting module. The process chamber has a gas outlet. The pump communicates with the gas outlet. The pump is configured to exhaust gas from the processing chamber via the gas outlet. The intersecting module is positioned between the pump and the gas outlet. The intersecting module includes a plurality of support members and a plurality of internal ventilating plates. The support members are arranged along a longitudinal direction. Each of the internal ventilating plates has a plurality of orifices. At least one of the internal ventilating plates is positioned between two of the support members positioned adjacent to each other in the longitudinal direction. Each of the internal ventilating plates is inclined relative to a transversal direction that is perpendicular to the longitudinal direction.

In accordance with some embodiments, an intersecting module for removing particles in a flow path that communicates with a pump is provided. The intersecting module includes a plurality of support members and a plurality of internal ventilating plates. The support members are arranged along a longitudinal direction. Each of the internal ventilating plates has a plurality of orifices. At least one of the internal ventilating plates is positioned between two of the support members positioned adjacent to each other in the longitudinal direction. One of the internal ventilating plates is inclined relative to a transversal direction that is perpendicular to the longitudinal direction by a first angle, and another of the internal ventilating plates is inclined relative to the transversal direction by a second angle. The first angle is different from the second angle.

In accordance with some embodiments, an intersecting module for removing particles in a flow path that communicates with a pump is provided. The intersecting module includes a plurality of internal ventilating plates. The internal ventilating plates have a plurality of orifices. The internal ventilating plates include a first group of internal ventilating plates, a second group of internal ventilating plates, and a third group of internal ventilating plates arranged along a longitudinal direction. The second group of internal ventilating plates is positioned between the first group of internal ventilating plates and third group of internal ventilating plates in the longitudinal direction. The first group of internal ventilating plates and the second group of internal ventilating plates are arranged in a staggered manner, and the second group of internal ventilating plates and the third group of internal ventilating plates are also arranged in a staggered manner.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An intersecting module, comprising:
   a plurality of support members arranged along a longitudinal direction;
   a plurality of internal ventilating plates each having a plurality of orifices, wherein at least one of the internal ventilating plates is positioned between two of the support members positioned adjacent to each other in the longitudinal direction; and
   a boundary ventilating plate positioned on one of the support members and arranged perpendicular to the longitudinal direction, wherein the support member on which the boundary ventilating plate is positioned has an opening, and the boundary ventilating plate covers an entirety of the opening,
   wherein one of the internal ventilating plates is inclined relative to a transversal direction that is perpendicular to the longitudinal direction by a first angle, another one of the internal ventilating plates is inclined relative to the transversal direction by a second angle, and the first angle is different from the second angle.

2. The intersecting module as claimed in claim 1, wherein each of the internal ventilating plates is inclined relative to the transversal direction.

3. The intersecting module as claimed in claim 2, wherein one of the internal ventilating plates, positioned between a first support member and a second support member of the support members, is inclined relative to the transversal direction by an obtuse angle; and
   wherein another one of the internal ventilating plates, positioned between the second support member and a third support member of the support members, is inclined relative to the transversal direction by an acute angle.

4. The intersecting module as claimed in claim 1, wherein the boundary ventilating plate has a plurality of orifices.

5. The intersecting module as claimed in claim 1, wherein the support members have a consistent width in the transversal direction.

6. An intersecting module, comprising:
   a plurality of support members arranged along a longitudinal direction; and
   a plurality of internal ventilating plates having a plurality of orifices,
   wherein at least one of the internal ventilating plates is positioned between two of the support members positioned adjacent to each other in the longitudinal direction, and each of the internal ventilating plates is inclined relative to a transversal direction that is perpendicular to the longitudinal direction,
   wherein the internal ventilating plates comprise a first group of internal ventilating plates and a second group of internal ventilating plates, the support members comprise a first support member, a second support member, and a third support member, the first group of internal ventilating plates is positioned between the first support member and the second support member, and the second group of internal ventilating plates is positioned between the second support member and the third support member.

7. The intersecting module as claimed in claim 6, wherein the internal ventilating plates are arranged in such a manner that projections of two of the internal ventilating plates in the longitudinal direction overlap.

8. The intersecting module as claimed in claim 6, wherein the first group of internal ventilating plates and the second group of internal ventilating plates are arranged in a staggered manner.

9. The intersecting module as claimed in claim 6, wherein one of the internal ventilating plates is inclined relative to the transversal direction by an obtuse angle, and another one of the internal ventilating plates is inclined relative to the transversal direction by an acute angle.

10. The intersecting module as claimed in claim 6, further comprising a boundary ventilating plate positioned on one of the support members and arranged perpendicular to the longitudinal direction.

11. The intersecting module as claimed in claim 10, wherein the boundary ventilating plate comprises a plurality of orifices.

12. The intersecting module as claimed in claim 10, wherein the support member on which the boundary ventilating plate is positioned has an opening, and the boundary ventilating plate covers an entirety of the opening.

13. The intersecting module as claimed in claim 6, further comprising a plurality of boundary ventilating plates positioned on each of the support members.

14. The intersecting module as claimed in claim 6, wherein the support members have a consistent width in the transversal direction.

15. The intersecting module as claimed in claim 6, wherein the internal ventilating plates further comprises a third group of the internal ventilating plates, and the second group of internal ventilating plates and the third group of internal ventilating plates are arranged in a staggered manner.

16. An intersecting module, comprising:
a plurality of support members arranged along a longitudinal direction; and
a plurality of internal ventilating plates having a plurality of orifices and comprising a first group of internal ventilating plates and a second group of internal ventilating plates,
wherein the support members comprise a first support member, a second support member, and a third support member, the first group of internal ventilating plates is positioned between the first support member and the second support member, and the second group of internal ventilating plates is positioned between the second support member and the third support member,
wherein the first group of the internal ventilating plates is inclined relative to a transversal direction that is perpendicular to the longitudinal direction by a first angle, and each of the first group of the internal ventilating plates is inclined by the first angle,
wherein the second group of the internal ventilating plates is inclined relative to the transversal direction by a second angle, and each of the second group of the internal ventilating plates is inclined by the second angle.

17. The intersecting module as claimed in claim 16, wherein the first angle is different from the second angle.

18. The intersecting module as claimed in claim 17, wherein the first angle is an obtuse angle, and the second angle is an acute angle.

19. The intersecting module as claimed in claim 16, wherein the internal ventilating plates further comprises a third group of the internal ventilating plates, the third group of the internal ventilating plates is inclined relative to the transversal direction by a third angle, each of the third group of the internal ventilating plates is inclined by the third angle, and the second angle is different from the third angle.

20. The intersecting module as claimed in claim 19, wherein the first group of internal ventilating plates and the second group of internal ventilating plates are arranged in a staggered manner, and the second group of internal ventilating plates and the third group of internal ventilating plates are also arranged in a staggered manner.

* * * * *